United States Patent [19]
Goldenberg Barany et al.

[11] Patent Number: 5,923,953
[45] Date of Patent: Jul. 13, 1999

[54] PROCESS FOR FORMING A HIGH GAIN, WIDE BANDGAP GALLIUM NITRIDE PHOTOCONDUCTOR HAVING PARTICULAR SENSITIVITY TO ULTRAVIOLET RADIATION

[75] Inventors: Barbara Goldenberg Barany, Falcon Heights; Scott A. McPherson, Eagan; Scott T. Reimer, Otsego; Robert P. Ulmer, Hopkins; J. David Zook, Minneapolis, all of Minn.; Maurice L. Hitchell, deceased, late of Lakeville, Minn., by Phyllis A. Hitchell, legal representative

[73] Assignee: Honeywell Inc., Minneapolis, Minn.

[21] Appl. No.: 08/789,036

[22] Filed: Jan. 27, 1997

Related U.S. Application Data

[63] Continuation-in-part of application No. 08/396,314, Feb. 28, 1995, Pat. No. 5,598,014.

[51] Int. Cl.[6] .................................................... H01L 21/02
[52] U.S. Cl. .................................................. 438/93; 438/57
[58] Field of Search ................................. 438/48, 57, 92, 438/93, 94; 257/184, 453

[56] References Cited

U.S. PATENT DOCUMENTS

| | | |
|---|---|---|
| 4,614,961 | 9/1986 | Khan et al. . |
| 5,182,670 | 1/1993 | Khan et al. . |
| 5,278,435 | 1/1994 | Van Hove et al. . |
| 5,677,538 | 10/1997 | Moustakas et al. . |

*Primary Examiner*—Charles Bowers
*Assistant Examiner*—Keith Christianson
*Attorney, Agent, or Firm*—Edward L. Schwarz

[57] ABSTRACT

A process for forming a UV sensitive gallium nitride layer includes a step of depositing a layer of aluminum nitride on which the gallium nitride layer is deposited. Two tests, sheet resistance and photoluminescent response of the gallium nitride layer, allow one to determine that a particular gallium nitride layer produced by the process will have the required response to UV radiation. Either a careful calibration which determines a required length of the aluminum nitride deposition time, or the introduction of silicon into the gallium nitride layer during its deposition, has been found to result in deposit of a gallium nitride layer which has superior UV sensing characteristics.

17 Claims, 4 Drawing Sheets

5,923,953

PROCESS FOR FORMING A HIGH GAIN, WIDE BANDGAP GALLIUM NITRIDE PHOTOCONDUCTOR HAVING PARTICULAR SENSITIVITY TO ULTRAVIOLET RADIATION

REFERENCE TO COPENDING PARENT APPLICATION

This is a continuation-in-part of pending U.S. patent application filed by Barbara Goldenberg Barany, Scott Reimer, Robert Ulmer, and J. David Zook on Feb. 28, 1995 and having U.S. Ser. No. 08/396,314 now U.S. Pat. No. 5,598,014.

BACKGROUND OF THE INVENTION

Burner controllers such as are used in furnaces and boilers must detect the presence of flame within the combustion chamber. There are a number of different flame characteristics on which the operation of flame detectors are based. One class detects the flickering infrared (IR) radiation generated by the flame. Another class senses the presence of the ionized particles which a flame produces. A third type senses the ultraviolet radiation which an active flame produces. It is possible to imagine situations where ionized particles or IR flicker may be present without an active flame. Many experts believe that ultraviolet sensing is the most reliable of these sensors since only an active flame produces enough heat to generate ultraviolet (UV) radiation. The present invention is a process for producing an improved UV flame detector.

A number of different types of ultraviolet radiation detectors have been used. Historically, the first of these were photomultiplier tubes. These have the disadvantages of requiring relatively high operating voltage, having a relatively small signal current, and having a relatively limited lifetime. There have therefore been attempts to replace these tube detectors with solid state devices.

A number of different solid state UV radiation detectors have been developed and used over the last few decades. One such type uses a cadmium sulfide material as the active element. These also require relatively high voltages and have relatively small signal currents. More recent devices using a UV-enhanced silicon semiconductor material as the active element have substantial sensitivity in the visible light spectrum, and hence require a filter which attenuates the visible light component of the radiation. These silicon devices have relatively high resistance when exposed to UV radiation. As a general principle, sensors having relatively low internal resistance are preferred, other things like sensitivity and longevity being equal. The lower the internal resistance, the higher the signal current for a given bias voltage. Higher signal current reduces the effect of noise and interference on the signal, allowing for simpler and cheaper leads and less complex amplifiers.

Where solid state sensors are concerned, the general procedure is now to create the layer of photosensitive material on an appropriate substrate. Then the metallization or electrical contacts are applied to the photosensitive layer. Frequently, this is in the form of photolithographic fingers which interleave on the photosensitive layer. A protective layer may then be applied to the layers. Then the substrate is cut into individual sensor elements and the individual sensor elements packaged.

It is now known that some gallium nitride-based detectors have superior sensitivity to UV radiation. For example, U.S. Pat. No. 5,278,435 discloses a semiconductor device having an active layer comprising gallium nitride (GaN) material and which exhibits linear response to UV radiation.

The MOCVD (metal organic chemical vapor deposition) process is another technical factor relating to this invention. The MOCVD process has for many years been standard for producing the active elements for various types of electronic devices, particularly opto-electronic devices. The MOCVD process allows one to deposit layers of metallic or semiconductor compounds on a heated substrate placed within a deposition chamber. It involves entraining an organic compound of one or more metals in a first hydrogen stream. A compound of nitrogen or other Group III element is entrained in a second hydrogen stream. The two hydrogen streams with their entrained materials are introduced into and flow through the deposition chamber, where the metallic and Group III materials deposit themselves on the heated substrate. By properly selecting the entrained elements and their concentrations (partial pressures); the temperature, pressure, duration, and flow rate parameters of the process; and the types of layers created, it is possible to make a variety of solid state semiconductor devices, including GaN devices which are sensitive to UV radiation.

The following description provides information for operating a MOCVD process for manufacturing a GaN UV radiation detector. We assume the reader is familiar with *Organometallic Vapor-Phase Epitaxy: Theory and Practice*, Gerald Stringfellow, Academic Press, Inc. 1989, which is a standard reference work on the MOCVD process.

BRIEF DESCRIPTION OF THE INVENTION

Our process for forming a GaN layer which can be used as the sensing element of a superior UV radiation photoconductive sensor (hereafter "superior sensor") includes a previously unknown sequence of deposition steps. A valuable characteristic of such a superior sensor is relative insensitivity to radiation of other wavelengths. In one embodiment the superior sensor is characterized as having a gallium nitride active layer in which are a number of electron donor sites and a smaller number of electron acceptor sites, where the concentration of the excess number of donor sites over the number of acceptor sites is approximately $10^{15}$ to $5 \times 10^{16}$ per cubic centimeter. The superior sensor also has a photoconductive gain substantially greater than one near a relatively low UV illumination of the active layer, which gain decreases with increasing UV illumination. "Gain" in this context means that a single photon causes more than one electron to free themselves and move between electrodes attached to the surface of the active layer and having different voltage potentials applied to them.

However, direct measurement of the concentration of the excess number of donor sites over the number of acceptor sites, particularly in GaN, is still quite difficult to do accurately. We have developed two other criteria which together we believe are necessary and sufficient for a gallium nitride active layer to form a part of a superior UV radiation photoconductive sensor and which in particular is relatively insensitive to non-UV radiation. The first criterion, which we call the photoluminescence criterion, applies to GaN material suitable for use in a superior sensor. Such material has an electron mobility that reaches its maximum as a function of temperature at less that 200° K. and is approximately 100 $cm^2$/V-sec or higher. When such gallium nitride is exposed to the 248 nm emission line of an excimer laser producing a 100 millijoule pulse of about 25 ns duration which generates a beam with a power density of 500–1000 $KW/cm^2$, the photoluminescence intensity of the gallium nitride layer at 3670 Angstroms is three to four orders of magnitude greater than the intensity near 4300 Angstroms or 5500 Angstroms, and further the intensity decreases essentially monotonically from 3700 Angstroms to at least 6000 Angstroms, i.e., from the UV to the visible light regions of the electromagnetic spectrum. The 4300 and 5500 Angstroms wavelengths are those at which we have observed photoluminescence of deleterious impurities. FIG. 5 shows the photoluminescence spectral response of a material which meets the photoluminescence criterion.

The second criterion for a superior sensor is that of effective sheet resistance in the approximate range of $10^4$ to $5\times10^6$ ohms/square after a short period without UV illumination. We measure the sheet resistance using conventional aluminum contacts bonded to the material surface with a titanium layer. To form the contacts, we first deposit a 400 Angstrom layer of titanium followed by a 1500 Angstrom layer of aluminum and then anneal the layers in nitrogen gas for 20 sec at 650° C. Measuring the sheet resistance by the standard van der Pauw procedure using indium dots to form the contacts with the GaN layer yields very similar results as to sheet resistance value.

A layer of gallium nitride meeting both of these criteria is essentially certain to strongly photoconduct in response to UV radiation of 3650 Angstroms and shorter UV wavelengths, and its electrical resistance will drop off rapidly with radiation of the same intensity but increasing wavelength. Sensors incorporating GaN layers meeting the photoluminescence and sheet resistance criteria are virtually certain to be superior sensors.

Our process for forming a gallium nitride layer which can form a part of a superior sensor has two distinct variants, both of which are capable of producing such photoconductors. Both variants include the conventional step of first cleaning and then mounting in a vacuum chamber a sapphire wafer having a polished surface. We then evacuate the chamber and adjust an outlet valve to a vacuum pump to hold the pressure in the chamber at approximately 76 torr. Next we heat the wafer to approximately 740 to 775° C. and preferably 750° C. We then allow a gas stream of both ammonia and triethyl aluminum (TEA) or other aluminum-containing metal organic compound to flow into the chamber in a nitrogen stream for a time interval of approximately 10 to 30 minutes so as to deposit on the polished wafer surface an aluminum nitride layer with a thickness of approximately 100 to 500 Angstroms.

The temperature of the wafer is then raised to approximately 1000° to 1050° C. When the temperature is stable, we allow flow of a gas stream into the chamber in which is triethyl gallium (TEG) or other gallium-containing metal organic compound and ammonia. The ammonia and TEG should have a partial pressure ratio greater than approximately 25:1. The inflowing gasses should together contribute fewer than 30 atoms of silicon per billion atoms of gallium. The TEG and ammonia flow should continue for a period of time on the order of an hour or more and sufficient to deposit a gallium nitride layer with a preferred thickness of approximately 6,500 to 10,000 Angstroms, but which could have a thickness of as much as 20,000 Angstroms.

In order for this process to produce a GaN layer from which a "superior sensor" may be formed, it is necessary to modify either the step for depositing the AlN layer or the step for depositing the GaN layer, and the modifications to each of these two steps constitute the two distinct variants for practicing the invention. The first variant, and the one we presently prefer, involves particularly calibrating the AlN depositing step so that subsequent deposition of the GaN layer according to the parameters mentioned above results in a GaN layer from which a superior sensor may be formed without further special efforts. We calibrate the AlN depositing step by adjusting the partial pressure of the TEA and the deposition time for a series of wafers until subsequently deposited GaN layers meet the photoluminescence and sheet resistance criteria for superior sensors.

In the second variant a controlled amount of silicon in the form of silane or other silicon-containing compound is introduced into the chamber during the GaN layer forming step. We find that this step also produces GaN layers which meet the photoluminescence and sheet resistance criteria for superior sensors. However, because these processes are somewhat "touchy", and tend to inconsistently produce GaN layers meeting the two criteria, we prefer the first variant of this process which is the one we have found to be more reliable. These deposition processes have inconsistent results because of uncontrollable variations in important parameters associated with the processes. Virtually each of the parameters of the processes may be a factor in producing GaN layers for superior sensors. It is not always possible for example to precisely control the purity of compounds used in the deposition steps because these are supplied by vendors. The effect of an extremely small concentration of certain impurities may cause the final product to fail one or both of the two criteria for a superior sensor. The first variant tends to be more tolerant of these uncontrollable variations in the process parameters, so the result is a higher yield of GaN from which superior sensors may be formed.

DESCRIPTION OF THE PREFERRED EMBODIMENTS

Figure 1:
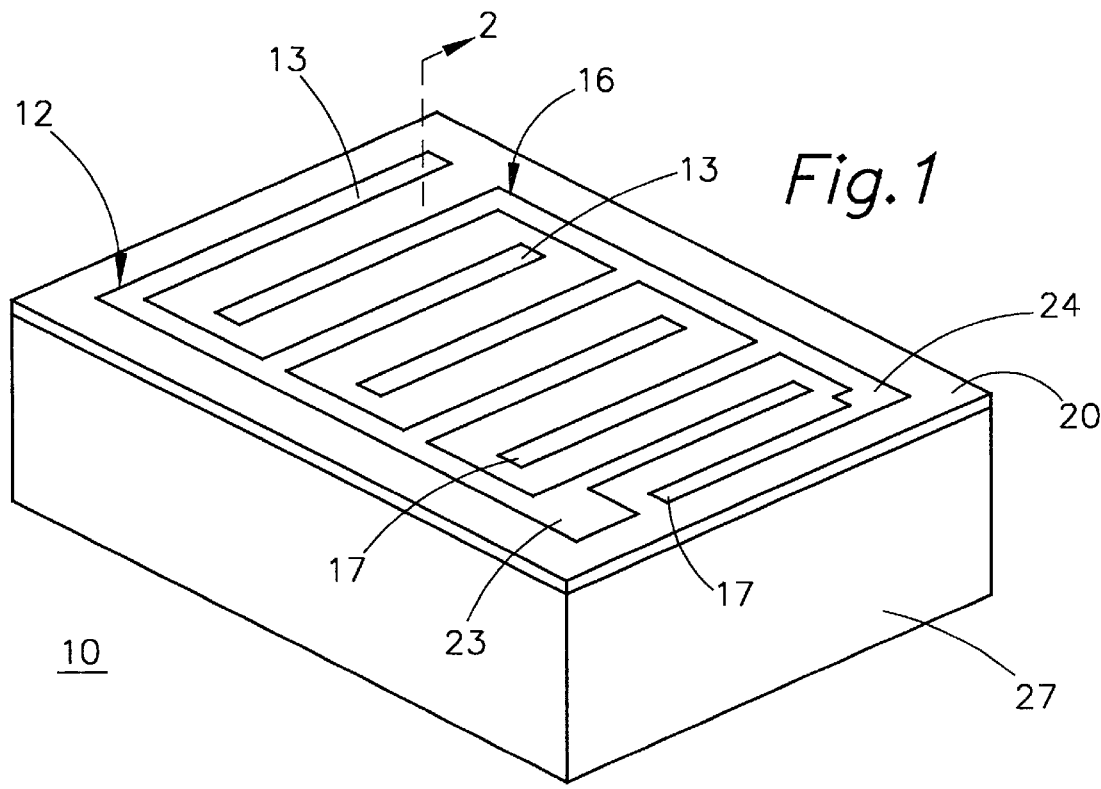
FIG. 1 is a perspective view of a UV photoconductor sensor in which the invention is embodied.

FIG. 1 discloses a preferred arrangement for a UV photoconductor sensor 10 to incorporate a GaN layer made by the process of this invention. Sensor 10 has a source electrode 12 and a drain electrode 16 lying on the surface of an N-type semiconductor active layer 20 and comprising GaN. UV radiation directed onto the top surface of active GaN layer 20 reduces the electrical resistance of layer 20 by a factor of 4 or more, and elements to be described shortly allow this resistance change to be detected. A substrate 27, typically formed of sapphire, supports active layer 20, with an intermediate layer 22, formed of aluminum nitride (AlN), not shown in FIG. 1, interposed between active layer 20 and substrate 27. Intermediate layer 22 is necessary for active layer 20 to have the desired characteristic of selective and high sensitivity in the UV spectral band of wavelengths in the approximate range of 200 to 365 nm.

Active layer 20 comprises mostly gallium nitride although there may be fractional concentrations of aluminum nitride and indium nitride therein for controlling spectral response.

Hereafter, we will refer to gallium nitride as the constituent of active layer 20, but the reader should understand that there may be detectable fractions of both indium nitride and aluminum nitride in active layer 20.

We prefer to deposit both the AlN intermediate layer 22 and the GaN active layer 20 using the MOCVD process mentioned above, and it is this process that has been used to produce the functional devices 10 we have made so far. For the most part we use standard MOCVD deposition practices. For our version of the process however, we have found that specific ranges for these parameters produce active layers 20 with the appropriate electrical characteristics. These specific ranges will be specified in the details of the process which we describe below. As is conventional for producing active layers using the MOCVD process, a sapphire wafer having space on its deposition for hundreds of individual sensors is coated with the active layer, and then as a later step in the process, sawed into individual sensors. This is an entirely conventional aspect of our process.

The change in resistivity of active layer 20 is detected by sensing the resistance between a source electrode 12 and a drain electrode 16, which comprise the metallization, i.e., surface electrical conductor elements, for this device. Source electrode 12 has a series of spaced apart parallel fingers 13. Drain electrode 16 has a plurality of spaced apart fingers 17 interleaved with, space apart from, and parallel to the fingers 13 of electrode 12 as shown in FIG. 1. The pattern shown for electrodes 12 and 16 in FIG. 1 is far from true scale because of the very small dimensions involved. In one preferred embodiment, each finger 13 and 17 may be approximately 20 $\mu$m wide, 450 $\mu$m long, 0.46 $\mu$m thick, and spaced from its adjoining finger(s) 13 or 17 by 40 $\mu$m. Each electrode has 4 fingers 13 or 17 as shown.

Figure 2:
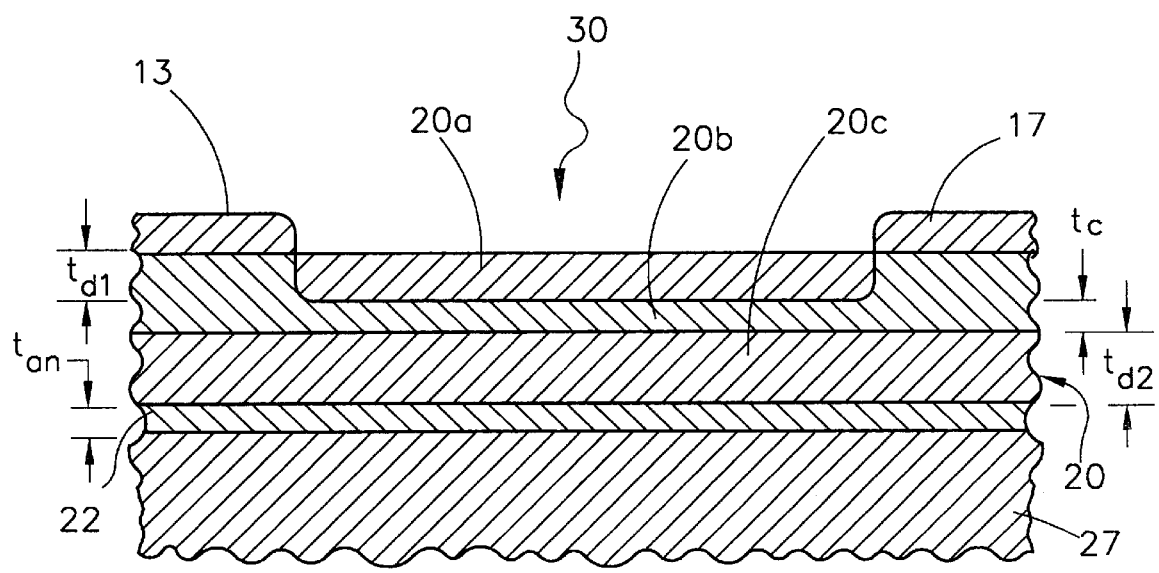
FIG. 2 is a cross sectional view of a portion of the sensor of FIG. 1, in which we show its electrical structure.

FIG. 2 is a cross section of sensor 10 in the vicinity of a finger 13 and a finger 17 as indicated by the cross section arrow of FIG. 1. One can see a part of the individual fingers 13 and 17 sitting atop the active layer 20 and making ohmic contact therewith. Active layer 20 is shown as having three individual sublayers or regions which we refer to hereafter as a variable depletion region 20a, a conduction channel 20b, and a fixed depletion region 20c. These three regions have effective thickness dimensions respectively of $t_{d1}$, $t_c$, and $t_{d2}$. Depletion regions 20a and 20c have a deficiency of current carriers, i.e. donor sites, and thus have a relatively high intrinsic resistance. Conduction channel 20b has an excess of donor sites and thus has a relatively low resistance. Active layer 20 is designed so that over its entire volume there is an average of approximately $10^{15}$ to $5 \times 10^{16}$ donor sites in excess of acceptor sites per cc., or 13 to 650 donor sites in excess of acceptor sites per $10^9$ gallium or other metal atoms. The absence of donor sites in depletion regions 20a and 20c is a boundary or surface effect in layer 20, occurring near its two surfaces.

We theorize that incident UV radiation symbolized by the wiggly arrow 30 affects conduction characteristics of active layer 20 by altering the relative thicknesses $t_{d1}$ and $t_c$ of depletion volume 20a and conduction channel 20b. The thickness of depletion volume 20c is relatively constant because UV radiation cannot penetrate volume 20a and channel 20b to reach depletion volume 20c to alter its conduction characteristic. When incident UV radiation intensity is relatively low, $t_c$ is small relative to $t_{d1}$ and because the highly conductive cross sectional area of conduction channel 20b is relatively small, resistance between fingers 13 and 17 is large. When incident UV radiation intensity is relatively large, tc actually changes quantitatively, becoming much larger relative to $t_{d1}$ and increasing the cross sectional area of conduction channel 20b. The larger area of conduction channel 20 decreases the resistance between fingers 13 and 17. This change in resistance is significant, typically at least a factor of 4 or more, and can easily be detected by conventional electrical circuitry. Incident UV radiation intensity can be measured in at least two different ways, photons per unit area per second, and watts per unit area. These measures of radiation intensity are interchangeable.

The reader should realize that the representation in FIG. 2 of the depletion regions 20a and 20c is idealized. It is certain that the actual transitions from depletion regions 20a and 20c to conduction channel 20b are not nearly as well defined as shown in FIG. 2. It is possible that there is a gradient over perhaps several percent of the total thickness of active layer 20, in the concentration of donor sites from the lowest in each of the depletion regions 20a and 20c to the highest in the conduction channel 20b. The actual shape of regions 20a and 20c and channel 20b is also idealized in FIG. 2. It is likely that these shapes are not as rectangular as shown. What the actual shapes are though is not easy to predict at this time. At any rate, the quantitative values of these dimensions may be considered equivalent for the heuristic purposes intended here.

Figure 3:
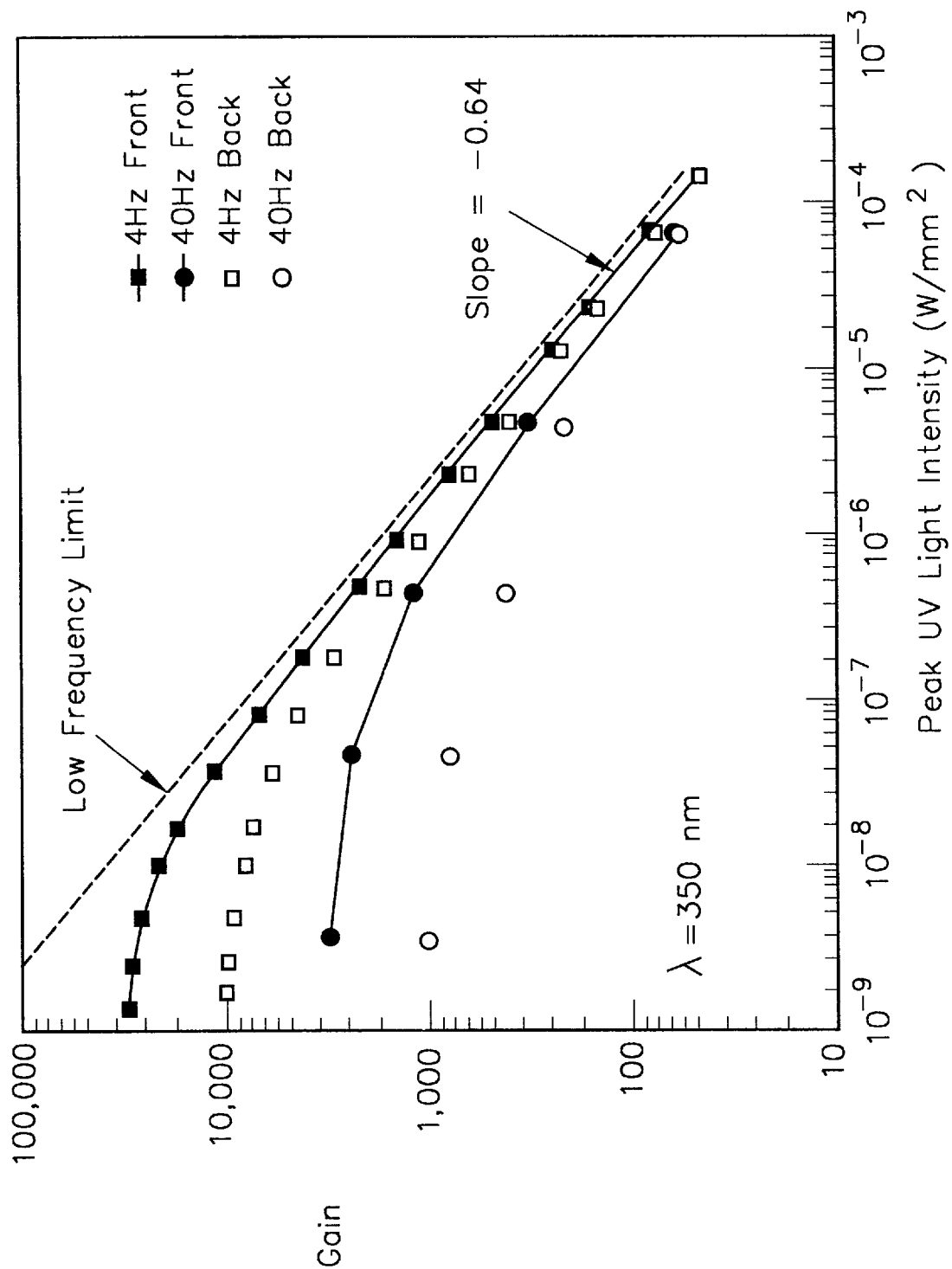
FIG. 3 is a graph showing photoconductive gain of the sensor as a function of UV light intensity.

Furthermore, the resistance change occurring for a preselected change in incident UV radiation when the present UV radiation level is small, is much greater percentagewise than when the present UV radiation is relatively large. This decreasing sensitivity to changes in UV radiation intensity as a function of increasing UV radiation intensity is shown in FIG. 3, which is a plot of gain for a typical sensor 10 versus incident UV radiation intensity. One can see that near the lowest appreciable level of UV radiation, a small change in the level of UV radiation causes a relatively large change in current flow. As UV radiation intensity increases, the change in current flow becomes increasingly smaller percentagewise.

Silicon is well known as one element which provides donor sites in gallium nitride and other nitride semiconductors. In one embodiment of this sensor 10 we have a uniform concentration of silicon atoms of approximately $10^{15}$ to $8 \times 10^{16}$ per cc throughout the active layer 20, which is sufficient to create a donor concentration of $10^{15}$ to $5 \times 10^{16}$ per cc. In another possible form of active layer 20, a relatively high concentration of silicon atoms is provided in the center of the thickness of active layer 20, within the conduction channel 20b to form the required donor sites. This concentration of silicon atoms is created by appropriately modifying the deposition step which forms active layer 20. An appropriate average concentration of silicon atoms is $10^{17}$ to $5 \times 10^{18}$ per cc within a centrally located narrow layer in active layer 20. The layer may be no thicker than 1 to 100 nm, and is created during the growth of conduction channel 20b, by briefly altering the composition of the gasses from which active layer 20 is deposited. Although silicon has been found to provide suitable results for providing donor sites, other materials may also be as suitable or even better.

We have previously mentioned that smaller amounts of aluminum and indium can be included as constituents of active layer 20 to achieve certain desirable characteristics in spectral response. One tendency noted in some samples of sensor 10 having the previously described structure, is sharply reduced gain at temperatures at and below approximately $-40°$ C. We believe, based on experience and analysis, that germanium, sulphur, selenium, and tin dopants in active layer 20 may reduce this tendency substantially. Accordingly, active layers 20 having such germanium, sulphur, selenium, and tin dopants form a part of our invention. Appropriate uniform concentrations here too are from $10^{15}$ to $8 \times 10^{16}$ atoms per cc within active layer 20.

FIG. 3 is a representative graph showing the relationship between gain and UV light intensity. The gain values on the ordinate are the actual number of electrons which flow to form the signal current due to a certain bias voltage between electrodes 12 and 16, and responsive to a single photon of the specified wavelength impinging on the active layer 20. One can see that gain tends to uniformly decrease with increasing UV light intensity. The values at very low levels of light intensity may not exhibit this decreasing gain characteristic, so the criterion is strictly true only for UV light intensity above some very low level, perhaps $10^{-9}$ $W/mm^2$. In this test, there were four different tests performed, as shown in the legend. Two were for UV light impinging directly on active layer 20 and two were with the UV light shining through the substrate 27. Note that sapphire is transparent to UV radiation. Two different frequencies were tested as shown, to determine frequency dependency of gain.

Figure 4:
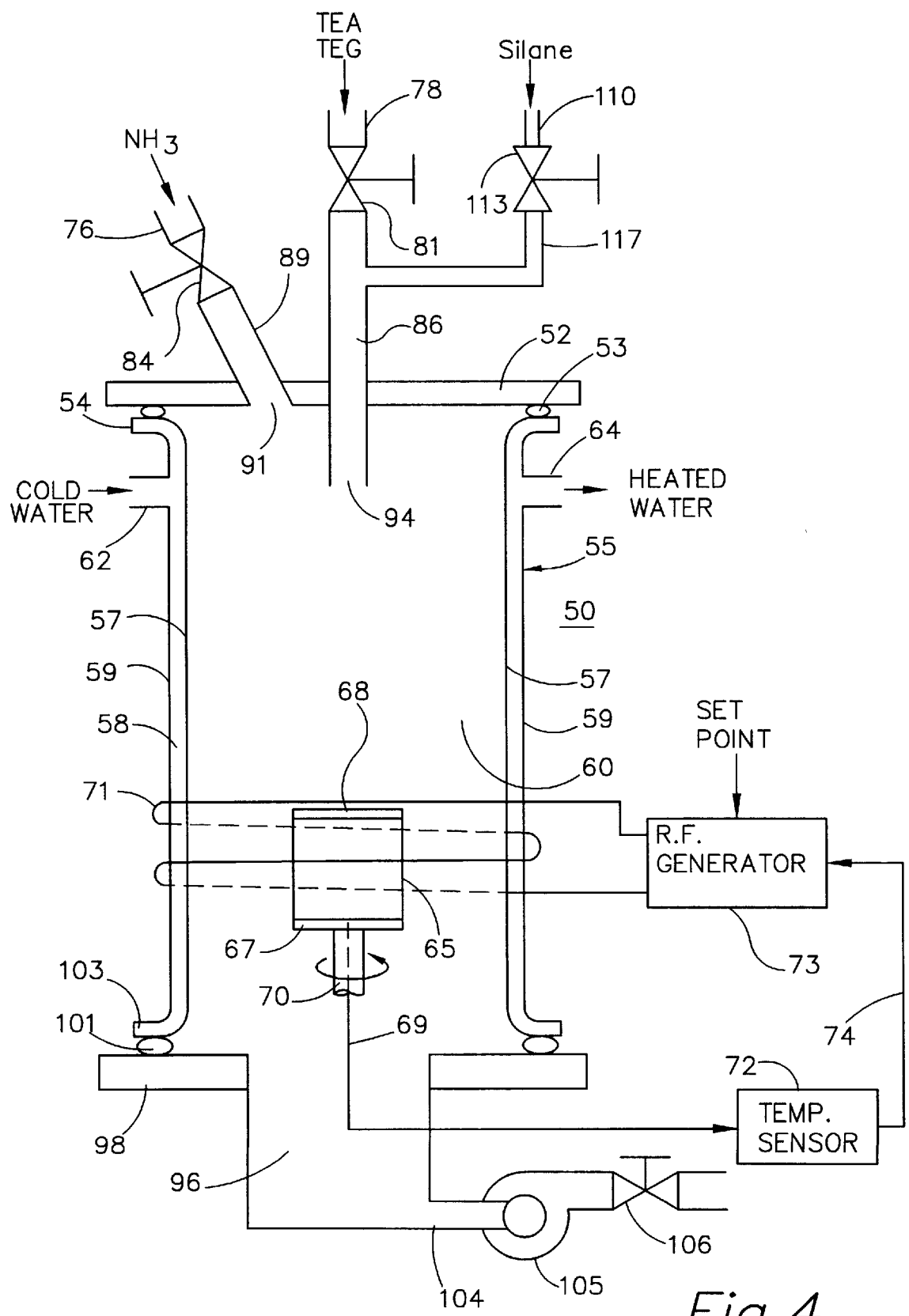
FIG. 4 is an outline diagram of a preferred apparatus for producing the sensor of FIG. 1.
Figure 5:
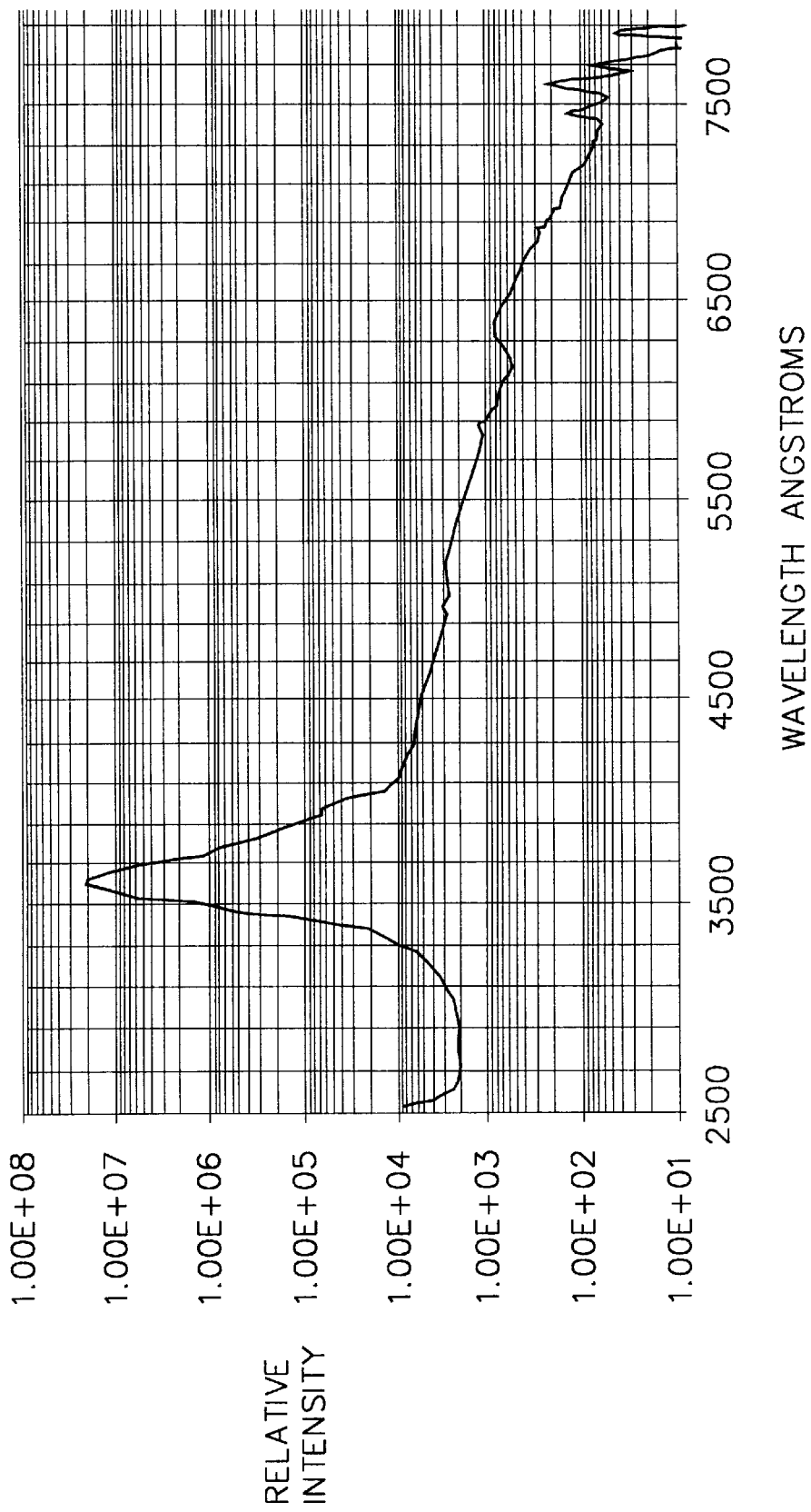
FIG. 5 is a graph showing the photoluminescence of a GaN layer meeting the photoluminescence criterion of a superior sensor.

We have developed a version of the MOCVD process for producing photoconductor 10. FIG. 4 is an outline diagram of the MOCVD equipment which we use to deposit the aluminum nitride intermediate layer 30 and the gallium nitride active layer 20. The person with ordinary skill in the art of practicing MOCVD processes knows that such processes are complex, and that their reproducibility and repeatability sometimes depends on factors which cannot be identified or accurately controlled. When components for apparatus such as that of FIG. 4 are first chosen, it is axiomatic that there will be a startup period during which yields will be lower than one expects. As the skilled user gains more experience with the apparatus, yields will increase and the occurrence of bad batches which must be totally discarded will become much less frequent. Furthermore, we have discovered certain parameters which we at the present time find to be critical, and these will all be identified and explained.

The MOCVD deposition apparatus 50 shown in FIG. 4 includes a cylindrical deposition chamber 55 defining an inner volume 60. Volume 60 is defined by an inner wall 57 and the inner surfaces of a bottom plate 98, and a top cover 52. Top cover 52 is clamped against a flange 54 with an O-ring 53 between them to prevent leaks. Chamber 55 also has an outer wall 59 spaced from inner wall 57. The space formed between inner wall 57 and outer wall 59, defines a cooling jacket 58 through which cooling water can circulate. Cooling water enters jacket 58 from an external source through a cold water inlet 62 and exits jacket 58 through outlet 64 after having been heated to boiling. The definition of inner volume 60 is completed by a bottom plate 98 clamped against flange 103 of chamber 55 with an O-ring 101 to prevent leakage. In our commercial embodiment the top cover 52 and bottom plate 98 are formed of stainless steel and the remainder of the chamber 55 described to this point is formed of quartz glass.

A pedestal 67 is mounted for rotation within chamber 55 on a shaft 70. A motor not shown, is magnetically connected to shaft 70 so that pedestal 67 can be rotated at any preselected speed. We prefer a rotational speed for shaft 70 of 1 rps for the entire deposition process involved here. Pedestal 67 supports a susceptor 65 comprising graphite and having a silicon carbide coating. Susceptor 65 is for supporting and heating a wafer 68 which comprises the substrate which receives the intermediate and active layers during the deposition process. Shaft 70, pedestal 67, and susceptor 65 are all centrally located within volume 60 in our embodiment, and we believe that this enhances desirable uniform flow of gasses within volume 60. A temperature sensor 72 has an optical temperature probe 69 which fits through a hollow core in shaft 70 and pedestal 67 with its end adjacent to the bottom surface of susceptor 65 resting on pedestal 67. The temperature sensor 72 receives radiation indicative of the susceptor 65 temperature transmitted by the probe 69, and provides a control signal on a path 74. While this is the most accurate means of sensing temperature of susceptor 65 available to us at the present time, it is not as accurate as we would like. In fact, we believe that a better means of measuring susceptor 65 temperature would enhance the performance of this process.

An external RF coil 71 is wound around the exterior of chamber 55 and powered by a 650 Khz RF generator 73 during deposition steps. In our embodiment, coil 71 has 5 turns rather than the 2 turns shown. By applying RF power to coil 71, it is possible to heat susceptor 65 and a wafer 68 sitting on it, to any temperature suitable for MOCVD processes, and at least 1100° C. A temperature set point value is supplied by the operator to RF generator 73. RF generator 73 also receives a signal from the temperature sensor 72 which indicates the temperature of susceptor 65. RF generator 73 adjusts its output to coil 71 so as to maintain the susceptor temperature at the set point. In this way, the temperature of wafer 68 can be held to a desired value with reasonable accuracy. In the two deposition steps of our process, the temperature of wafer 68 is quite critical; pains should be taken to hold the temperatures specified below with good accuracy.

The gasses in which are entrained the materials to be deposited on wafer 68 are introduced through tubes 86 and 89 in cover 52. Inlet tubes 86 and 89 have a gas-tight mounting in cover 52. A quartz glass inlet portion of tube 86 projects through cover 52 so that its end 94 is below the inner (bottom) surface of cover 52 by an appreciable amount. A supply tube 78 for tri-ethyl gallium (TEG) or other organic compound of gallium is connected to inlet tube 86 by a flow control valve 81. A supply tube 76 for ammonia ($NH_3$) is connected to inlet tube 89 by a flow control valve 84. By adjusting valves 81 and 84, the flow rates of TEG and ammonia into volume 60 can be accurately controlled. Ammonia and TEG flow rates appear to be critical process parameters.

Gasses within volume 60 exit through an exhaust port 96 and duct 104. A vacuum pump 105 reduces pressure with chamber 55 to the desired value of 76 torr or less, with a flow control valve 106 setting the actual desired chamber pressure of 76 torr.

It is possible to provide for adding other materials to either the ammonia or the TEG stream as well. For example, there is shown in FIG. 4 a further supply tube 110, in this example for silane entrained in hydrogen gas, is shown. A valve 113 controls the flow of this silane-containing gas stream to an inlet tube 117, by which the silane is introduced into the TEG stream.

The following Process Steps Table defines the operating steps and their order for producing active layers of gallium nitride on wafers 68 suitable for sawing after the metallization has been added, into superior sensors 10 of the type described and which meet both of the criteria mentioned in the Brief Description section. The Process Parameters Table defines the parameter values and apparatus dimensions to be used in the process steps. It is not possible to determine for every one of this rather extensive list of parameters, which of the values may turn out to be critical. For example, we have found that the spacing between end 94 of tube 86 and the top of wafer 68 specified below, provides acceptable performance both from the standpoint of product characteristics and of yield. Yet this is not a parameter which is easy to change in an operating system, and there may well be other values which function as well or even better. We strongly recommend that a person wishing to practice this invention should start with the values we provide in order to minimize the time required to optimize the process for his or her particular installation.

There are many other requirements for successfully operating an MOCVD process which are well known to those of skill in the art. These are documented in a number of sources, such as the Stringfellow reference identified above.

PROCESS STEPS TABLE

Clean surface of wafer 68

Allow sufficient water to flow into inlet 62 to maintain wall 57 near 100° C.

Adjust valve 96 throughout the following steps to maintain pressure in volume 60 at 76 torr±0.2 torr Adjust RF generator 73 to hold temperature of susceptor 65 temperature ~750° C. (range 740 to 775° C.) (Critical value—must be held as accurately as possible, ±1° C., and should be optimized for the particular equipment and chemicals; the actual optimized value will usually be in or very close to the specified range)

For a 10 minute first interval (range 10 to 30 minutes, tolerance ±5% of actual interval length), deposit an aluminum nitride (AlN) layer by introducing a flow of tri-ethyl aluminum (TEA) through valve 81 into inlet tube 94 to maintain a partial pressure of TEA within inlet tube 94 of $2.4 \times 10^{-3}$ torr (range $10^{-3}$ to $5 \times 10^{-3}$) and a total flow of gasses through tube 94 of 881 standard cc/min (range 750 to 1000 standard cc/min), and ammonia to flow through valve 84 to maintain a partial pressure of ammonia of 0.42 torr within inlet tube 89 and a total flow of gasses through tube 89 of 1942 standard cc/min (range 1500 to 2500 standard cc/min); mass flow controllers should be selected to minimize precision error; the final thickness of the AlN layer should be approximately 100 to 500 Angstroms; but see discussion of the first variant for this process depending on a precisely held and empirically determined AlN deposition time resulting from performing the Calibration Process Steps Table following Adjust RF generator 73 to raise the temperature of susceptor 65 to 1000° C. (range 1000 to 1050° C., tolerance ±1° C.) and hold For a second interval of 80 minutes (range 20 to 120 min), deposit a gallium nitride (GaN) by introducing a flow of tri-ethyl gallium (TEG) or other gallium-based organic compound through valve 81 into inlet tube 94 to maintain a partial pressure thereof within inlet tube 94 of 0.03 torr (range 0.02 to 0.12 torr) and a total flow of gasses through tube 94 of 776 standard cc/min (range 750 to 1000 cc/min); ammonia to flow through valve 84 to maintain a partial pressure of ammonia of 0.63 torr (range 0.63 to 1 torr) within inlet tube 89 and a total flow of gasses through tube 89 of 3015 standard cc/min (range 2500 to 4000 cc/min); the number silicon atoms in the tri-ethyl gallium should be <30 per billion gallium atoms; the final thickness of the GaN layer should be preferably about 6,500 to 10,000 Angstroms (maximum range 6,500 to 20,000 Angstroms); the ratio of the partial pressure of the gallium to the partial pressure of the ammonia in the vicinity of the substrate is preferably about 1:100 (range 1:25 to 1:200)

When the second of the two variants of the process is practiced:
a) During the second interval, allow silane or other gas containing other dopant elements to flow through valve 113 and tube 117 to maintain a partial pressure of silane or other gas within tube 94 of $4 \times 10^{-6}$ torr; (preferred version of the variant), or
b) During a subinterval of from 6 sec to 10 min centered in the second interval, allow silane or other gas containing other dopant elements to flow through valve 113 and tube 117 to maintain a partial pressure of silane or other gas within tube 94 of $1.5 \times 10^{-5}$ torr Cool wafer 68 to room temperature, maintaining flow of the ammonia stream until the wafer 68 temperature has fallen to at least 400° C.

Add metallization patterns as shown in FIG. 1 according to well known photolithographic processes; test individual sensor sites Saw wafer 68 into individual sensors 10

The amount of silicon has a substantial effect on the difference between the concentrations of donor and acceptor sites regardless of the variant practiced. It is difficult to maintain the integrity of the process for either variant if the silicon content of the TEG is not consistently low as specified. This has the effect for the first variant of producing GaN layers which are virtually free of silicon, and for the second variant of allowing the concentration of silicon in the GaN to be very accurately controllable by the silane-introducing step.

There are both ranges and tolerances specified for many of the process parameter values in the Process Steps Table. The ranges are intended to assist a person of skill in the art while the process is being developed for a deposition system. Once the process has been developed, the tolerances mentioned are our best estimates at this time as to what deviations from derived process parameter values are permissible without substantial degrading of process performance.

We have previously mentioned that there are two variants possible for providing GaN layers suitable for superior sensors. The preferred (first) variant focuses on extremely careful selection and control of the parameters of the AlN deposition step, particularly those affecting its thickness. However, the appropriate AlN layer thickness depends on the various other parameters of the deposition chamber and the process itself. The thickness selection or calibration process can be done in a hit or miss manner, but we have found this to be time-consuming and inefficient. We prefer to calibrate the AlN layer deposition step to produce a suitable thickness for the AlN layer by modifying the process of the above Process Steps Table as follows to create an AlN deposition step calibration process.

The range of 100 to 500 Angstroms thickness for the AlN layer is an estimate. We think that a thickness for it in the approximate range of 300 to 500 Angstroms is likely to be most satisfactory. It is not always easy though to control the thickness of a deposited AlN layer for an uncalibrated deposition system 50 by simply setting the deposition parameters. The issue is further complicated by the fact that at the present time it is very difficult to accurately measure very thin (<1000 Angstroms) deposited AlN layers. We have found however, that it is not necessary to know the exact thickness of an AlN layer which produces a superior sensor. It is possible to produce a superior sensor by carefully defining the parameters of the AlN deposition step which have been previously determined to result in deposition by a particular deposition apparatus 50 of GaN layers which form superior photoconductive sensors. This tuning process is what we call "calibration", and once this has been done we find that the process becomes quite stable. Such a process with a calibrated AlN deposition step will provide GaN layers for superior sensors from that apparatus 50 for a substantial percentage of many repetitions.

We prefer to calibrate an AlN step by first estimating or empirically determining the parameters of AlN deposition which will produce an AlN layer thickness in the range of 300 to 500 Angstroms, and for the purpose of preliminary calculations, 400 Angstroms. We take advantage of the ability to accurately measure the thickness of AlN layers >1000 Angstroms in the following Calibration Process Steps Table by deliberately depositing a test AlN layer which will surely be thicker than 1000 Angstroms and which employs the specific apparatus 50, and then modifying individual parameters in an iterative process to converge on a set of process parameter values which produce superior sensors.

CALIBRATION PROCESS STEPS TABLE

Deposit a test thickness of AlN by performing the Process Steps Table steps through AlN layer deposition as stated, except extend the time $t_{dep}$ of the AlN deposition step to at least about 60 min, and in any case, long enough to deposit an AlN layer of 1000 Angstroms or other thickness sufficient to be measured with reasonable accuracy Measure the thickness $t_{test}$ of the AlN layer Calculate a preliminary AlN layer deposition time $t_{pre}$=400 Angstroms×$t_{dep}$/$t_{test}$.

If $t_{pre}$ falls within or near the 10 to 30 min. range specified in the Process Steps Table, use $t_{pre}$ as the time for the AlN layer deposition step to complete a first complete test run of the Process Steps Table Test the GaN layer which results under the sheet resistance criterion of effective sheet resistance of $10^4$ to $5\times10^6$ ohms/square after a short period without UV illumination If the GaN layer passes the sheet resistance test, then perform the photoluminescence test; if both tests are passed then the AlN deposition step has been calibrated, and an AlN deposition time for direct use in the Process Steps Table has been determined If the GaN layer sheet resistance is not within the specified range, then $t_{pre}$ is lengthened or shortened and further test runs are done until the sheet resistance and the photoluminescence criteria are met by the GaN layer produced.

If the process cannot be made to produce GaN layers which satisfy the two criteria while the AlN deposition time is within the 10 to 30 min range then change the partial pressures of TEA and ammonia proportionately and repeat all of the steps in this Calibration Process Steps Table as necessary to produce an AlN test layer with the 10 to 30 min preferred deposition time Our operating system has a number of physical dimensions which affect the operation of the process, and these are defined in the following System Parameters Table. These are representative only, and other values for them will surely allow the process to operate successfully. Differences will however result in somewhat different values for the deposition step parameters.

SYSTEM PARAMETERS TABLE

Volume 60 diameter . . . 7.0 cm
Volume 60 height . . . 29 cm
Susceptor 65 diameter . . . 5.1 cm
Susceptor 68 height . . . 3.8 cm
Distance tube 94 projects into volume 60 . . . 3.6 cm
Inside diameter of tube 94 . . . 0.3 cm
Inside diameter of tube 91 . . . 0.46 cm
Distance between end of tube 94 and top of wafer 68 14.48 cm In the parent to this application, we felt that the presence of a certain amount of silicon was a desirable means for providing the required difference between the concentrations of donor and acceptor sites. We now believe that the use of a calibrated AlN deposition step time provides somewhat better yield and stability for this process than the direct introduction of a silicon compound during gallium nitride deposition.

We claim:

1. A process for depositing a gallium nitride layer from which may be formed a photoconductive sensor, comprising the steps of:

a) mounting in a chamber a sapphire wafer having a polished surface;

b) heating the wafer to approximately 740 to 775° C.;

c) depositing on the polished wafer surface an aluminum nitride layer of a thickness of less than approximately 1000 Angstroms;

d) heating the wafer to approximately 1000 to 1050° C.; and e) introducing a gas stream into the chamber entraining ammonia and an organic gallium compound with a partial pressure ratio greater than approximately 25:1, and having less than approximately 30 silicon atoms per billion gallium atoms entrained therein, to produce a gallium nitride layer having an effective sheet resistance of $10^4$ to $5\times10^6$ ohms/square.

2. The process of claim 1, wherein the aluminum nitride layer deposition step comprises the step of depositing aluminum nitride to a thickness of 100 to 500 Angstroms.

3. The process of claim 2 including the step of heating the polished wafer surface to approximately 750° C. during the aluminum nitride layer deposition step.

4. The process of claim 3, wherein the gallium nitride depositing step includes the step of flowing a gaseous mixture of ammonia and an organic gallium compound into the chamber, wherein the partial pressure of ammonia to the organic gallium compound is in the range of approximately 25:1 to 200:1.

5. The process of claim 1, wherein the gallium nitride depositing step includes the step of flowing a gaseous mixture of ammonia and an organic gallium compound into the chamber, wherein the partial pressure of ammonia to the organic gallium compound is in the range of approximately 25:1 to 200:1.

6. The process of claim 1 including the step of heating the polished wafer surface to approximately 750° C. during the aluminum nitride layer deposition step.

7. The process of claim 1, wherein the partial pressure of ammonia ranges from 0.6 torr to one torr.

8. The process of claim 1, wherein the aluminum nitride layer deposition step comprises the step of depositing aluminum nitride to a thickness of 300 to 500 Angstroms.

9. The process of claim 8, including the step of calibrating the aluminum nitride deposition step time.

10. The process of claim 1, including the step of calibrating the aluminum nitride deposition step time.

11. A process for depositing a gallium nitride layer from which may be formed a photoconductive sensor, comprising the steps of:

a) mounting in a chamber a sapphire wafer having a polished surface;
b) heating the wafer to approximately 740 to 775° C.;
c) depositing on the polished wafer surface an aluminum nitride layer of a thickness of less than approximately 1000 Angstroms during a determined deposition step time;
d) heating the wafer to approximately 1000 to 1050° C.;
e) flowing into the chamber a gas stream entraining an organic gallium compound, and ammonia wherein the ammonia has a partial pressure in the range of 0.6 to one torr; and
f) at least one of i) calibrating the aluminum nitride deposition step time, and ii) introducing silicon into the gas stream entraining the organic gallium compound, to deposit a gallium nitride layer having an effective sheet resistance of $10^4$ to $5 \times 10^6$ ohms/square.

12. The process of claim 11 wherein the aluminum nitride layer deposition step comprises the step of depositing aluminum nitride to a thickness of 100 to 500 Angstroms.

13. The process of claim 12 including the step of heating the polished wafer surface to approximately 750° C. during the aluminum nitride layer deposition step.

14. The process of claim 13, wherein the gallium compound flowing step includes the step of flowing a gaseous mixture of ammonia and an organic gallium compound into the chamber, wherein the partial pressure of ammonia to the organic gallium compound is in the range of approximately 25:1 to 200:1.

15. The process of claim 11, wherein the gallium nitride depositing step includes the step of flowing a gaseous mixture of ammonia and an organic gallium compound into the chamber, wherein the partial pressure of ammonia to the organic gallium compound is in the range of approximately 25:1 to 200:1.

16. The process of claim 11, including the step of heating the polished wafer surface to approximately 750° C. during the aluminum nitride layer deposition step.

17. The process of claim 11, wherein the silicon-introducing step includes the step of introducing silicon into the gallium compound-entraining gas stream for a portion only of the time the gallium compound-entraining gas stream is flowing.

* * * * *